United States Patent
Lee et al.

(10) Patent No.: US 9,577,157 B2
(45) Date of Patent: *Feb. 21, 2017

(54) LIGHT EMITTING DIODE CHIP HAVING DISTRIBUTED BRAGG REFLECTOR AND METHOD OF FABRICATING THE SAME

(71) Applicant: Seoul Viosys Co., Ltd., Ansan-si (KR)

(72) Inventors: Sum Geun Lee, Ansan-si (KR); Sang Ki Jin, Ansan-si (KR); Jin Cheol Shin, Ansan-si (KR); Jong Kyu Kim, Ansan-si (KR); So Ra Lee, Ansan-si (KR); Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/069,260

(22) Filed: Mar. 14, 2016

(65) Prior Publication Data

US 2016/0197243 A1 Jul. 7, 2016

Related U.S. Application Data

(63) Continuation of application No. 14/590,493, filed on Jan. 6, 2015, now Pat. No. 9,324,919, which is a
(Continued)

(30) Foreign Application Priority Data

| Nov. 13, 2009 | (KR) | 10-2009-0109870 |
| Feb. 12, 2010 | (KR) | 10-2010-0013166 |
| Nov. 19, 2010 | (KR) | 10-2010-0115347 |

(51) Int. Cl.
*H01L 33/00* (2010.01)
*H01L 33/46* (2010.01)
(Continued)

(52) U.S. Cl.
CPC ............. *H01L 33/46* (2013.01); *H01L 27/153* (2013.01); *H01L 33/0008* (2013.01);
(Continued)

(58) Field of Classification Search
CPC .................................. H01L 33/10; H01L 33/46
See application file for complete search history.

(56) References Cited

U.S. PATENT DOCUMENTS

| 5,779,924 A | 7/1998 | Krames et al. |
| 6,040,590 A | 3/2000 | Obrien et al. |
(Continued)

FOREIGN PATENT DOCUMENTS

| CN | 1652363 | 8/2005 |
| CN | 1996627 | 7/2007 |
(Continued)

OTHER PUBLICATIONS

Korean Office Action dated Jun. 20, 2016, Korean Patent Application No. 10-2010-0115347 with English Translation.
(Continued)

*Primary Examiner* — Samuel Gebremariam
(74) *Attorney, Agent, or Firm* — H.C. Park & Associates, PLC

(57) ABSTRACT

A light-emitting diode package, including a package body and leads, the package body including a mounting surface, a light-emitting structure disposed on the mounting surface, the light-emitting structure including an active layer disposed between a first conductive-type semiconductor layer and a second conductive-type semiconductor layer, a phosphor layer disposed on the light-emitting structure, and a distributed Bragg reflector disposed between the light-emitting structure and the mounting surface. The distributed Bragg reflector includes a first distributed Bragg reflector and a second distributed Bragg reflector, and an optical
(Continued)

thickness of material layers within the first distributed Bragg reflector is greater than an optical thickness of material layers within the second distributed Bragg reflector.

15 Claims, 12 Drawing Sheets

Related U.S. Application Data continuation of application No. 13/023,876, filed on Feb. 9, 2011, now Pat. No. 8,963,178, which is a continuation-in-part of application No. 12/917,937, filed on Nov. 2, 2010, now Pat. No. 8,907,360.

(51) Int. Cl.
| | | |
|---|---|---|
| H01L 27/15 | (2006.01) | |
| H01L 33/22 | (2010.01) | |
| H01L 33/50 | (2010.01) | |
| H01L 33/60 | (2010.01) | |
| H01L 33/62 | (2010.01) | |

(52) U.S. Cl.
CPC .......... *H01L 33/22* (2013.01); *H01L 33/505* (2013.01); *H01L 33/60* (2013.01); *H01L 33/62* (2013.01); *H01L 33/0079* (2013.01); *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 6,515,308 | B1 | 2/2003 | Kneissl et al. |
| 6,552,369 | B2 | 4/2003 | Chiou et al. |
| 6,744,071 | B2 | 6/2004 | Sano et al. |
| 7,622,746 | B1 | 11/2009 | Lester et al. |
| 7,704,763 | B2 | 4/2010 | Fujii et al. |
| 7,768,023 | B2 | 8/2010 | Diana et al. |
| 7,804,104 | B2 | 9/2010 | Lin et al. |
| 8,373,188 | B2 | 2/2013 | Suh et al. |
| 8,426,872 | B2 | 4/2013 | Erchak et al. |
| 8,907,360 | B2 | 12/2014 | Lee et al. |
| 8,963,178 | B2 | 2/2015 | Lee et al. |
| 9,343,631 | B2 * | 5/2016 | Lee ................... H01L 27/153 |
| 2002/0024055 | A1 | 2/2002 | Uemura et al. |
| 2002/0055218 | A1 | 5/2002 | Chiou et al. |
| 2005/0013334 | A1 | 1/2005 | Watanabe et al. |
| 2005/0104078 | A1 | 5/2005 | Cheng et al. |
| 2006/0054905 | A1 | 3/2006 | Schwach et al. |
| 2006/0169993 | A1 | 8/2006 | Fan et al. |
| 2006/0284195 | A1 | 12/2006 | Nagai |
| 2007/0187698 | A1 | 8/2007 | Lee et al. |
| 2008/0191233 | A1 | 8/2008 | Yang et al. |
| 2008/0303047 | A1 | 12/2008 | Shen et al. |
| 2008/0303052 | A1 | 12/2008 | Lee et al. |
| 2009/0032830 | A1 | 2/2009 | Li |
| 2009/0057702 | A1 | 3/2009 | Chiu |
| 2009/0114935 | A1 | 5/2009 | Huang et al. |
| 2009/0283783 | A1 | 11/2009 | Streubel |
| 2010/0001258 | A1 | 1/2010 | Shimizu et al. |
| 2010/0032701 | A1 | 2/2010 | Fudeta |
| 2010/0148199 | A1 | 6/2010 | Kim et al. |
| 2010/0225226 | A1 | 9/2010 | Murazaki et al. |
| 2011/0114969 | A1 | 5/2011 | Lee et al. |
| 2011/0164308 | A1 | 7/2011 | Arsenault et al. |
| 2012/0025244 | A1 | 2/2012 | Suh et al. |
| 2012/0126203 | A1 | 5/2012 | Knapp |

FOREIGN PATENT DOCUMENTS

| | | |
|---|---|---|
| CN | 101015071 | 8/2007 |
| CN | 101197417 | 6/2008 |
| CN | 101438423 | 5/2009 |
| EP | 1667241 | 6/2006 |
| EP | 1 521 313 | 12/2010 |
| JP | 07-254732 | 10/1995 |
| JP | 11-126763 | 5/1999 |
| JP | 11-126925 | 5/1999 |
| JP | 2001-156327 | 6/2001 |
| JP | 2003-124576 | 4/2003 |
| JP | 2003-528421 | 9/2003 |
| JP | 2005-109113 | 4/2005 |
| JP | 2006-108673 | 4/2006 |
| JP | 2006-351808 | 12/2006 |
| JP | 2007-505479 | 3/2007 |
| JP | 2007-273975 | 10/2007 |
| JP | 2008-117922 | 5/2008 |
| JP | 2008-130663 | 6/2008 |
| JP | 2008-135697 | 6/2008 |
| JP | 2008-527626 | 7/2008 |
| JP | 2008-536294 | 9/2008 |
| JP | 2008-544540 | 12/2008 |
| JP | 2009-088299 | 4/2009 |
| JP | 2010-021546 | 1/2010 |
| JP | 2010-135798 | 6/2010 |
| KR | 10-2005-0014343 | 2/2005 |
| KR | 10-2005-0079279 | 8/2005 |
| KR | 10-2005-0096010 | 10/2005 |
| KR | 10-2006-0059783 | 6/2006 |
| KR | 10-0679235 | 1/2007 |
| KR | 10-2007-0072826 | 7/2007 |
| KR | 10-2008-0017180 | 2/2008 |
| KR | 10-2008-0061694 | 7/2008 |
| KR | 10-2009-0039932 | 4/2009 |
| KR | 10-0902894 | 6/2009 |
| KR | 10-2009-0103472 | 10/2009 |
| KR | 10-2010-0035846 | 4/2010 |
| TW | 200822203 | 5/2008 |
| WO | 00/76010 | 12/2000 |
| WO | 2005/024960 | 3/2005 |
| WO | 2006/059828 | 6/2006 |
| WO | 2006/083413 | 8/2006 |
| WO | 2006/093937 | 9/2006 |
| WO | 2008/082097 | 7/2008 |
| WO | 2009/057551 | 5/2009 |
| WO | 2011/016820 | 2/2011 |

OTHER PUBLICATIONS

Non-Final Office Action of U.S. Appl. No. 13/100,879 was mailed Jun. 15, 2012.
Notice of Allowance of U.S. Appl. No. 13/100,879 was mailed Nov. 27, 2012.
Y.S. Zhao, et al., "Efficiency Enhancement of InGaN/GaN Light-Emitting Diodes with a Back-Surface Distributed Bragg Reflector", Journal of Electronic Materials, Aug. 13, 2003, pp. 1521-1526, vol. 32, No. 12.
Non-Final Office Action dated Apr. 10, 2014 in U.S. Appl. No. 13/099,127.
Non-Final Office Action dated Apr. 11, 2014 in U.S. Appl. No. 12/917,937.
Non-Final Office Action issued on Jun. 6, 2013 in U.S. Appl. No. 12/917,937.
Non-Final Office Action issued on Jun. 17, 2013 in U.S. Appl. No. 13/760,637.
Preliminary Notice of First Office Action issued on Jun. 19, 2013 in Taiwanese Patent Application No. 099127122.
Non-Final Office Action issued on Oct. 10, 2013 in U.S. Appl. No. 13/099,127.
Partial European Search Report issued in European Application No. 10177001.4, dated Nov. 8, 2013.
Non-Final Office Action issued on Dec. 10, 2013 in U.S. Appl. No. 13/760,637.
Extended European Search Report issued on Feb. 25, 2014 in European Patent Application No. 10177001.4.
Alfred Thelen, "Design of Optical Interference Coatings", McGraw-Hill Book Company, Jan. 1, 1989, pp. 1-223, Hanau, Germany.

(56) References Cited

OTHER PUBLICATIONS

Final Office Action dated Jul. 18, 2014 in U.S. Appl. No. 13/7602,637.
Notice of Allowance issued on Aug. 11, 2014 in U.S. Appl. No. 13/760,637.
Notice of Allowance issued Sep. 15, 2014, in U.S. Appl. No. 12/917,937.
Non-Final Office Action dated Nov. 7, 2014 in U.S. Appl. No. 13/099,127.
International Search Report mailed on Dec. 20, 2011 in International Application No. PCT/KR2011/003269.
Non-Final Office Action issued on Apr. 2, 2013 in U.S. Appl. No. 13/099,127.
Non-Final Office Action issued on Mar. 25, 2013 in U.S. Appl. No. 13/023,876.
Non-Final Office Action issued on Apr. 5, 2013 in U.S. Appl. No. 13/023,876.
Notice of Allowance issued Aug. 27, 2013 in U.S. Appl. No. 13/023,876.
Supplemental Notice of Allowance issued Dec. 18, 2014 in U.S. Appl. No. 13/023,876.
Chih-Chien Lin, et al., "GaN-Based Resonant-Cavity Light-Emitting Diodes With Top and Bottom Dielectric Distributed Bragg Reflectors", IEEE, Sep. 1, 2010, pp. 1291-1293, vol. 22, No. 17.
Y. Higuchi, et al., "Room-Temperature CW Lasing of a GaN-Based Vertical-Cavity Surface-Emitting Laser by Current Injection", Applied Physics Express 1, 2008, pp. 121102-1-121102-3.
S. J. Chang, et al., "Nitride-Based LEDs With a Hybrid Al Mirror + Tio2/Sio2 DBR Backside Reflector", Journal of Lightwave Technology, Sep. 1, 2008, pp. 3131-3136, vol. 26, No. 17.
Chinese Office Action issued on Dec. 22, 2014, in Chinese Application No. 201180037028.7.
Chinese Office Action issued Apr. 21, 2015, in corresponding Chinese Application No. 201180005026.X.
Final Office Action issued Dec. 18, 2015, in U.S. Appl. No. 14/608,150.
Notice of Allowance mailed Dec. 7, 2015, in U.S. Appl. No. 14/606,863.
Taiwan Office Action issued Jun. 29, 2015, in corresponding Chinese Application No. 10420858030.
Non-Final Office Action issued Jul. 9, 2015, in U.S. Appl. No. 14/590,493.
Notice of Allowance mailed Sep. 15, 2015, in U.S. Appl. No. 14/590,493.
Notice of Allowance mailed Jan. 20, 2016, in U.S. Appl. No. 14/590,493.
Japanese Office Action issued Jul. 19, 2016, in Japanese Patent Application No. 2015-204069.
Office Action dated Oct. 31, 2016 in Taiwanese Patent Application No. 10521342700 (with English translation).

* cited by examiner

Prior Art

FIG. 10A
FIG. 10B
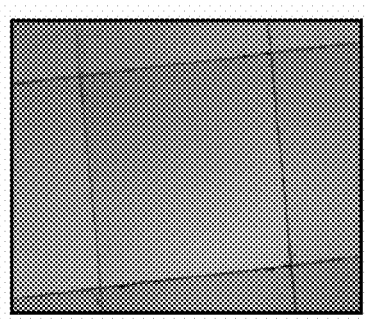
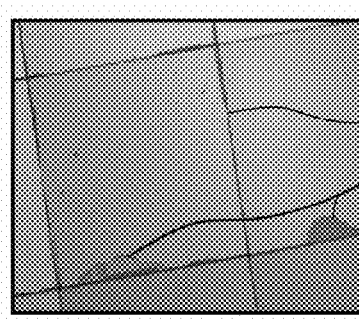
Scribe line
Crack
FIG. 11
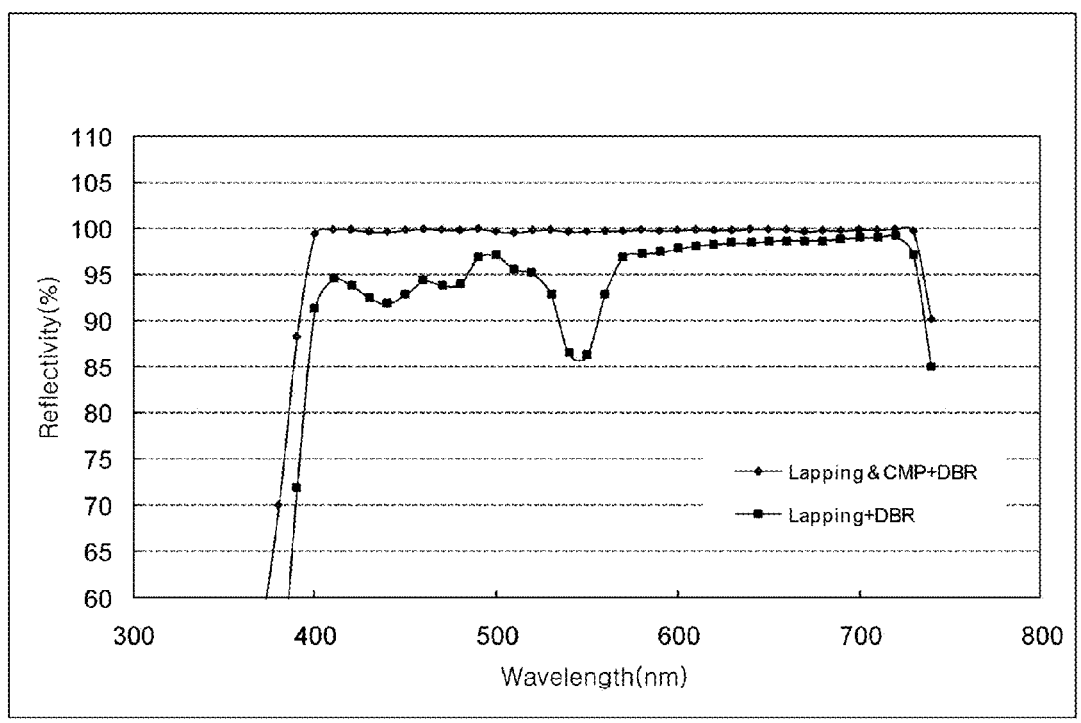

LIGHT EMITTING DIODE CHIP HAVING DISTRIBUTED BRAGG REFLECTOR AND METHOD OF FABRICATING THE SAME

CROSS-REFERENCE TO RELATED APPLICATIONS

This application is a continuation of U.S. patent application Ser. No. 14/590,493, filed on Jan. 6, 2015, now issued as U.S. Pat. No. 9,324,919, which is a continuation of U.S. patent application Ser. No. 13/023,876, filed on Feb. 9, 2011, now issued as U.S. Pat. No. 8,963,178, which is a continuation-in-part of U.S. application Ser. No. 12/917,937, filed on Nov. 2, 2010, now issued as U.S. Pat. No. 8,907,360, and claims priority from Korean Patent Application No. 10-2010-0013166, filed on Feb. 12, 2010, Korean Patent Application No. 10-2010-0115347, filed on Nov. 19, 2010, and Korean Patent Application No. 10-2009-0109870, filed on Nov. 13, 2009, which are all hereby incorporated by reference for all purposes as if fully set forth herein.

BACKGROUND

Field

Exemplary embodiments of the present invention relate to a light emitting diode chip and a method of fabricating the same, and to a light emitting diode chip having a distributed Bragg reflector and a method of fabricating the same.

Discussion of the Background

A gallium nitride-based light emitting diode chip emitting blue or ultraviolet wavelength light may be used for various applications. In particular, various types of light emitting diode packages emitting mixed color light, for example, white light required for a backlight unit, general lighting, or the like, have been marketed.

Since the light output from the light emitting diode package may depend on the light emission efficiency of the light emitting diode chip, research to improve the light emission efficiency of the light emitting diode chip has been continuously conducted. In particular, attempts to improve the light extraction efficiency of the light emitting diode chip have been performed. For example, technology of forming a metal reflector or a distributed Bragg reflector (DBR) on a bottom surface of a transparent substrate such as a sapphire substrate has been researched.

FIG. 1 shows reflectivity measured by forming an aluminum layer on the bottom surface of a sapphire substrate according to the related art.

It can be appreciated from FIG. 1 that in the case of the sapphire substrate on which the aluminum layer is not formed, reflectivity of about 20% is shown, but in the case of the sapphire substrate on which the aluminum layer is formed, reflectivity of about 80% is shown over a visible wavelength range.

FIG. 2 shows the reflectivity measured by the DBR formed by periodically applying $TiO_2/SiO_2$ to the bottom surface of the sapphire substrate according to the related art.

As shown in FIG. 2, when the DBR is formed to reflect light emitted from the light emitting diode chip, for example, emitted light having a peak wavelength of 460 nm. FIG. 2 shows that reflectivity in the light emitting diode using the DBR may reach approximately 100% in a blue wavelength range, for example, a wavelength range of 400 to 500 nm.

However, the DBR can only increase the reflectivity for a part of the visible range. Therefore, the reflectivity for other ranges is considerably lower than that shown in FIG. 2 for the wavelength range of 400 nm to 500 nm. That is, as shown in FIG. 2, the reflectivity for a wavelength of about 520 nm or more is suddenly reduced while most of the reflectivity is less than 50% at a wavelength of 550 nm or more.

Therefore, when mounting the light emitting diode chip using the DBR in a light emitting diode package to emit white light, the DBR shows high reflectivity for light of the blue wavelength range emitted from the light emitting diode chip but the DBR does not show efficient reflection characteristics for light emitted in the green and/or red wavelength ranges. Therefore, there is a limit in improving the light emission efficiency of the light emitting diode package.

Meanwhile, attempts have been made to apply the DBR to the reflecting surface of the light emitting diode package, which have not been achieved due to a limitation of the DBR deposition technology. For example, there have been problems with a deposition temperature, a plasma temperature, and the like.

SUMMARY

Exemplary embodiments of the present invention provide a light emitting diode chip capable of increasing light emission efficiency of a light emitting diode package implementing a mixed color light, for example, white light, and a method of fabricating the same.

Exemplary embodiments of the present invention also provide a DBR having high reflectivity over a wide wavelength range and a light emitting diode chip having the same.

Exemplary embodiments of the present invention also provide a light emitting diode package capable of improving light emission efficiency.

Exemplary embodiments of the present invention also provide a distributed Bragg reflector having high reflectivity over a wide wavelength range, a light emitting diode chip having the same, and a light emitting diode package having the same.

Additional features of the present invention will be set forth in the description which follows, and in part will be apparent from the description, or may be learned by practice of the present invention.

An exemplary embodiment of the present invention discloses a light-emitting diode package, including a package body and leads, the package body including a mounting surface, a light-emitting structure disposed on the mounting surface, the light-emitting structure including an active layer disposed between a first conductive-type semiconductor layer and a second conductive-type semiconductor layer, a phosphor layer disposed on the light-emitting structure, and a distributed Bragg reflector disposed between the light-emitting structure and the mounting surface. The distributed Bragg reflector includes a first distributed Bragg reflector and a second distributed Bragg reflector, and an optical thickness of material layers within the first distributed Bragg reflector is greater than an optical thickness of material layers within the second distributed Bragg reflector.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the present invention and are incorporated in and constitute a part of this specification, illustrate exemplary embodiments of the present invention.

FIG. 10A and FIG. 10B each are plan views showing the distributed Bragg reflector after a dicing process is performed.

FIG. 11 is a graph showing the reflectivity of the distributed Bragg reflector according to the presence and absence of chemical mechanical polishing (CMP) after the sapphire substrate lapping process by a copper surface plate.

DETAILED DESCRIPTION OF THE ILLUSTRATED EMBODIMENTS

Figure 1:
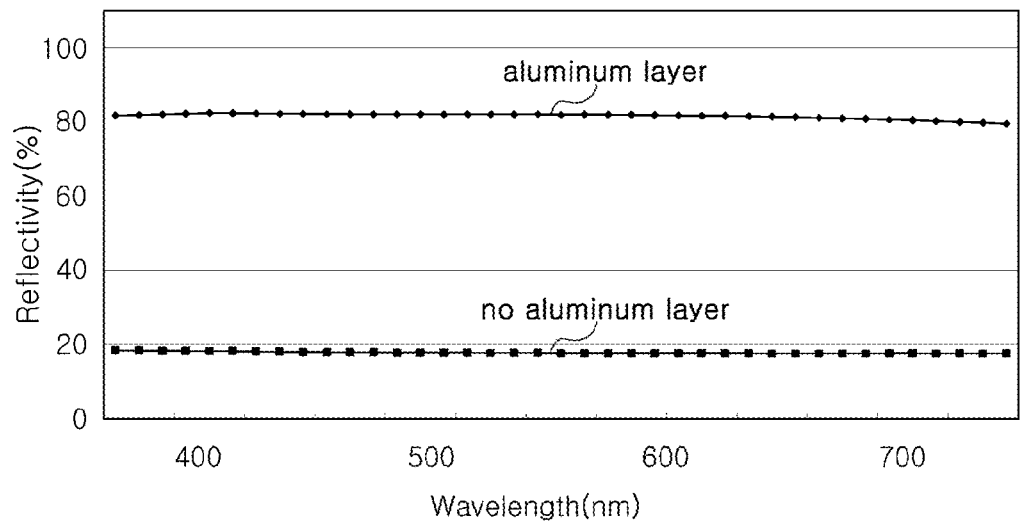
FIG. 1 is a graph showing reflectivity of aluminum on a sapphire substrate according to the related art.
Figure 2:
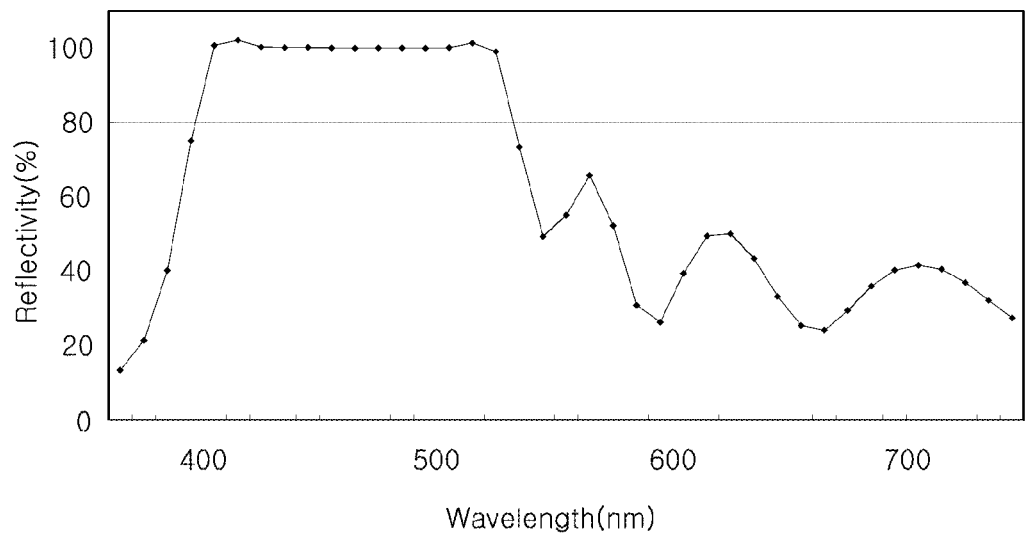
FIG. 2 is a graph showing reflectivity of a distributed Bragg reflector on the sapphire substrate according to the related art.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure is thorough, and will fully convey the scope of the present invention to those skilled in the art. In the drawings, the size and relative sizes of layers and regions may be exaggerated for clarity. Like reference numerals in the drawings denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," "right," "left," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 3:
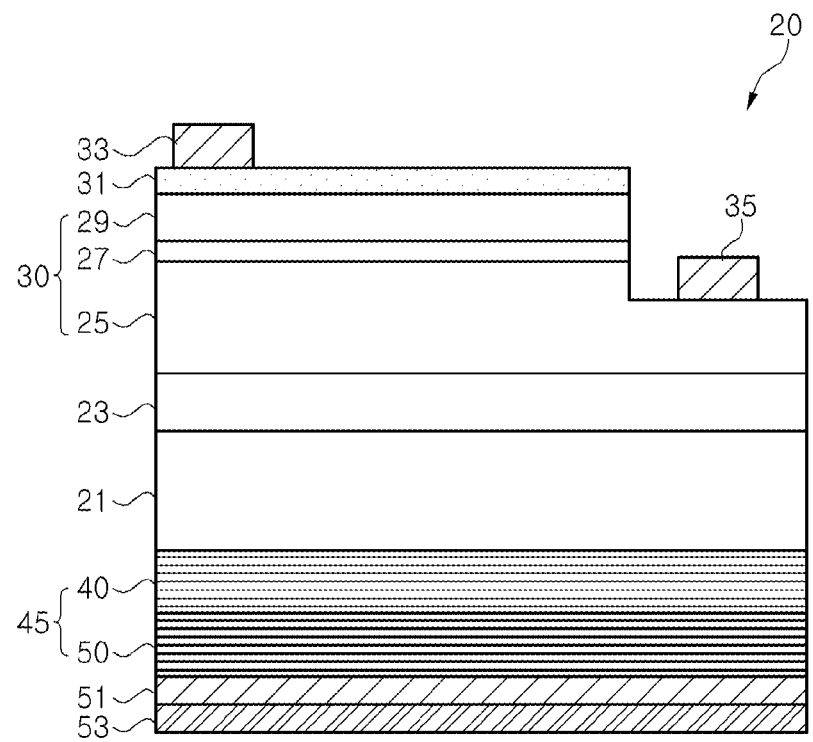
FIG. 3 is a cross-sectional view showing a light emitting diode chip having the distributed Bragg reflector according to an exemplary embodiment of the present invention.
Figure 4:
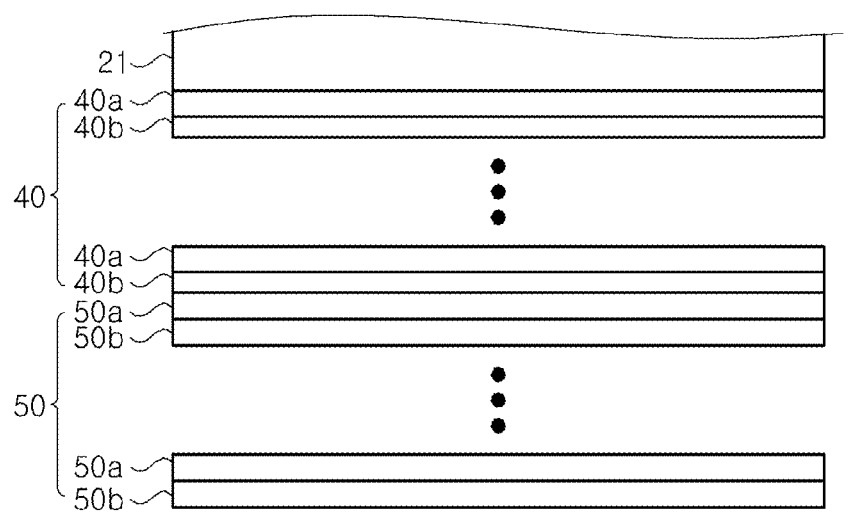
FIG. 4 is a magnified cross-sectional view of the distributed Bragg reflector of FIG. 3.

FIG. 3 is a cross-sectional view showing a light emitting diode chip 20 having the distributed Bragg reflector 45 according to an exemplary embodiment of the present invention and FIG. 4 is a magnified cross-sectional view of the distributed Bragg reflector 45 of FIG. 3.

Referring to FIG. 3, a light emitting diode chip 20 includes a substrate 21, a light emitting structure 30, and a distributed Bragg reflector 45. In addition, the light emitting diode chip 20 may include a buffer layer 23, a transparent electrode 31, a p-electrode pad 33, an n-electrode pad 35, a reflective metal layer 51, and a protective layer 53.

The substrate 21 is a transparent substrate, for example, a sapphire or a SiC substrate, but not specifically limited thereto. An upper surface, i.e., front surface of the substrate 21 may have a predetermined pattern, such as a patterned sapphire substrate (PSS). Meanwhile, an area of the substrate 21 determines the entire chip area. In the exemplary embodiments of the present invention, as the chip area of the light emitting diode chip is relatively increased, the reflection effect is increased. Therefore, the area of the substrate 21 may be 90,000 $\mu m^2$ or more. In some embodiments, it may be 1 $mm^2$ or more.

A light emitting structure 30 is positioned on the substrate 21. The light emitting structure 30 includes a first conductive-type semiconductor layer 25, a second conductive-type semiconductor layer 29, and an active layer 27 interposed between the first and second conductive-type semiconductor layers 25 and 29. In this configuration, the first conductive-type layer 25 and the second conductive-type layer 29 have a conductive type opposite to each other. The first conductive-type may be an n-type, and the second conductive-type may be a p-type, or vice versa.

The first conductive-type semiconductor layer 25, the active layer 27, and the second conductive-type semiconductor layer 29 may be made of a gallium nitride-based compound semiconductor material, that is, (Al, In,Ga)N. The constituent elements and composition of the active layer 27 are determined to emit light of a required wavelength, for example, ultraviolet or blue light. The first conductive-type semiconductor layer 25 and/or the second conductive-type semiconductor layer 29 may be formed in a single layer structure as shown or a multi-layer structure. In addition, the active layer 27 may be formed to be a single quantum well structure or a multi quantum well structure. In addition, a buffer layer 23 may be interposed between the substrate 21 and the first conductive-type semiconductor layer 25.

The semiconductor layers 25, 27, and 29 may be formed using a metal-organic chemical vapor deposition (MOCVD) technology or a molecular beam epitaxy (MBE) technology and a region of the first conductive-type semiconductor layer 25 may be patterned to be partially exposed using a photolithography and etching process.

Meanwhile, the transparent electrode layer 31 may be formed of, for example, indium tin oxide (ITO) or Ni/Au, on the second conductive-type semiconductor layer 29. The transparent electrode layer 31 serves to spread current due to a lower specific resistance than the second conductive-type semiconductor layer 29. A p-electrode pad 33 is formed on the transparent electrode layer 31 and an n-electrode pad 35 is formed on the first conductive-type semiconductor layer 25. As shown, the p-electrode pad 33 may be electrically connected to the second conductive-type semiconductor layer 29 through the transparent electrode layer 31.

Meanwhile, the distributed Bragg reflector 45 is positioned on the lower portion, i.e., rear surface of the substrate 21. The distributed Bragg reflector 45 includes a first distributed Bragg reflector 40 and a second distributed Bragg reflector 50.

Referring to FIG. 4, the first distributed Bragg reflector 40 is formed by repeating a plurality of pairs of first material layers 40a and second material layers 40b and the second distributed Bragg reflector 50 is formed by repeating a plurality of pairs of third material layers 50a and fourth material layers 50b. The plurality of pairs of first material layer 40a and second material layer 40b have relatively higher reflectivity for light of a red wavelength range, for example, 550 nm or 630 nm, than for light of a blue wavelength range and the second distributed Bragg reflector 50 may have relatively higher reflectivity for light of a blue wavelength range, for example, light of 460 nm than for light of a red or green wavelength range. In this case, the optical thickness of the material layers 40a and 40b within the first distributed Bragg reflector 40 is thicker than the optical thickness of the material layers 50a and 50b within the second distributed Bragg reflector 50, or vice versa, without being limited thereto.

The first material layer 40a may be the same material as the third material layer 50a, that is, have the same refractive index (n), and the second material layer 40b may be the same material as the fourth material layer 50b, that is, have the same refractive index (n). For example, the first material layer 40a and the third material layer 50a may be made of $TiO_2$ (n equals about 2.5) and the second material layer 40b and the fourth material layer 50b may be made of $SiO_2$ (n equals about 1.5).

Meanwhile, the optical thickness (refractive index×thickness) of the first material layer 40a may substantially have the relationship of an integer multiple with the optical thickness of the second material layer 40b, and the optical thicknesses thereof may be substantially the same as each other. In addition, the optical thickness of the third material layer 50a may substantially have the relationship of an integer multiple with the optical thickness of the fourth material layer 50b, and the optical thicknesses thereof may be substantially the same as each other.

In addition, the optical thickness of the first material layer 40a may be thicker than that of the third material layer 50a and the optical thickness of the second material layer 40b may be thicker than that of the fourth material layer 50b. The optical thickness of the first to fourth material layers 40a,

40*b*, 50*a*, and 50*b* may be controlled by controlling the refractive index and/or thickness of each material layer.

Referring back to FIG. 3, the reflective metal layer 51 of Al, Ag, or Rh, or the like, may be formed on the lower portion of the distributed Bragg reflector 45 and a protective layer 53 for protecting the distributed Bragg reflector 45 may be formed thereon. The protective layer 53 may be made of any one metal layer of, for example, Ti, Cr, Ni, Pt, Ta, and Au or an alloy thereof. The reflective metal layer 51 or the protective layer 53 protects the distributed Bragg reflector 45 from external impact or pollution. For example, the reflective metal layer 51 or the protective layer 53 prevents the distributed Bragg reflector 45 from being deformed from a material such as an adhesive when the light emitting diode chip is mounted in the light emitting diode package. In addition, the reflective metal layer 51 may reflect light transmitted through the distributed Bragg reflector 45. Therefore, the thickness of the distributed Bragg reflector 45 may be relatively reduced. The distributed Bragg reflector 45 shows relatively high reflectivity, but may transmit visible light of a long wavelength range having a large incident angle. Therefore, the reflective metal layer 51 may be disposed on the lower portion of the distributed Bragg reflector 45 to reflect light transmitted through the distributed Bragg reflector 45, thereby improving light emission efficiency.

According to the present exemplary embodiment, the distributed Bragg reflector 45 including the first distributed Bragg reflector 40 having high reflectivity for visible light of a relatively long wavelength and the second distributed Bragg reflector 50 having high reflectivity for visible light of a relatively short wavelength is provided, wherein the first distributed Bragg reflector 40 and the second distributed Bragg reflector 50 are stacked to form the distributed Bragg reflector 45. The distributed Bragg reflector 45 may increase the reflectivity for light over most of the visible range by a combination of the first distributed Bragg reflector 40 and the second distributed Bragg reflector 50.

The distributed Bragg reflector according to the related art has high reflectivity for light of a specific wavelength range but has relatively low reflectivity for light of a different wavelength range, such that there is a limit in improving the light emission efficiency in the light emitting diode package emitting white light. However, according to the present exemplary embodiment, the distributed Bragg reflector 45 may have high reflectivity for light of the blue wavelength range as well as high reflectivity for light of the green wavelength range and light of the red wavelength range, thereby making it possible to improve light emission efficiency of the light emitting diode package.

In addition, as compared to the case where the second distributed Bragg reflector 50 is disposed to be closer to the substrate 21 than the first distributed Bragg reflector 40, the light loss in the distributed Bragg reflector 45 may be further reduced in the case where the first distributed Bragg reflector 40 is disposed to be closer to the substrate than the second distributed Bragg reflector 50.

Although the present exemplary embodiment describes two reflectors, i.e., the first distributed Bragg reflector 40 and the second distributed Bragg reflector 50, more reflectors may be used. In this case, the reflectors having relatively higher reflectivity for a long wavelength may be positioned to be relatively closer to the light emitting structure 30.

In addition, in the present exemplary embodiment, the thicknesses of the first material layers 40*a* within the first distributed Bragg reflector 40 may be different from each other. Further, the thicknesses of the second material layers 40*b* may be different from each other. In addition, the thicknesses of the third material layers 50*a* within the second distributed Bragg reflector 50 may be different from each other. Further, the thicknesses of the fourth material layers 50*b* may be different from each other.

Although the present exemplary embodiment describes that the distributed Bragg reflector 45 is disposed on the lower portion of the substrate 21, the distributed Bragg reflector 45 may be disposed between the substrate 21 and the light emitting structure 30. In this case, the first distributed Bragg reflector 40 may be disposed to be closer to the light emitting structure 30 than the second distributed Bragg reflector 50.

The present exemplary embodiment describes that the material layers 40*a*, 40*b*, 50*a*, and 50*b* are made of $SiO_2$ or $TiO_2$, but is not limited thereto. Therefore, they may be made of, other materials, for example, $Si_3N_4$, a compound semiconductor, or the like. However, the difference in the refractive indexes between the first material layer 40*a* and the second material layer 40*b* and the difference in the refractive indexes between the third material layer 50*a* and the fourth material layer 50*b* may be at least 0.5.

In addition, the larger the number of pairs of the first material layers 40*a* and the second material layers 40*b* in the first distributed Bragg reflector 40 and the number of pairs of the third material layers 50*a* and the fourth material layers 50*b* in the second distributed Bragg reflector 50, the higher the reflectivity becomes. The total number of pairs may be 20 or more total pairs.

The surface roughness of the rear surface of the substrate 21 may be controlled before forming the distributed Bragg reflector 45. When the surface roughness of the rear surface of the substrate 21 is relatively large, it may be difficult to obtain high reflectivity over a wide wavelength range by the distributed Bragg reflector 45. When the interface between the distributed Bragg reflector 45 and the substrate 21 is defective, the distributed Bragg reflector 45 may be easily deformed. The deformation may cause a problem of reducing reflectivity of the distributed Bragg reflector 45 even if a slight thermal process is applied when the light emitting diode chip is mounted in, for example, the light emitting diode package. The surface roughness of the rear surface of the substrate 21 may be controlled to have root-mean-square (RMS) value of 3 nm or less. Alternatively, the surface roughness of the rear surface of the substrate 21 may have an RMS value of 2 nm or less. In some embodiments, it may have an RMS value of 1 nm or less.

A method of fabricating a distributed Bragg reflector 45 and a light emitting diode chip will now be described.

First, the surface roughness of the substrate 21 is controlled before forming the distributed Bragg reflector 45. For example, the rear surface of the substrate 21 on which the light emitting structures are formed is primarily ground to remove a part of the substrate 21. In this case, the rear surface of the substrate 21 is scratched by the grinding, such that it is relatively very rough. Thereafter, the surface of the substrate 21 is lapped using slurry having small particles. In the lapping process, the depth of the groove such as the scratch in the surface of the substrate 21, etc., is reduced, thereby reducing the surface roughness. In this case, the surface roughness of the rear surface of the substrate 21 may be controlled to be 3 um or less by controlling a particle size of diamond slurry and a surface plate used in the lapping process. However, generally, it is difficult to control the surface roughness using only the lapping process using the surface plate and the slurry particle. Therefore, after reducing the surface roughness by the lapping process, the rear surface of the substrate 21 may be polished by a chemical mechanical polishing (CMP) process. The surface roughness of the rear surface of the substrate 21 may be controlled up to 1 nm or less by the CMP process.

Then, the material layers having different refractive indexes, such as $TiO_2$, $SiO_2$, and $Si_3N_4$, or the like are alternately deposited on the surface of the substrate 21. The deposition of the material layers may be made by various methods such as sputtering, electron beam deposition, plasma enhanced chemical vapor deposition (PECVD) method, etc. In particular, the ion assisted deposition may be used. The ion assisted deposition forms the material layers having the proper thickness by measuring the reflectivity of the material layer deposited on the substrate 21, such that it is suitable to form the material layers of the distributed Bragg reflector.

After the distributed Bragg reflector is formed, the metal layer may be formed on the distributed Bragg reflector. Thereafter, the substrate is diced, thereby completing the individual light emitting diode chips.

Figure 5:
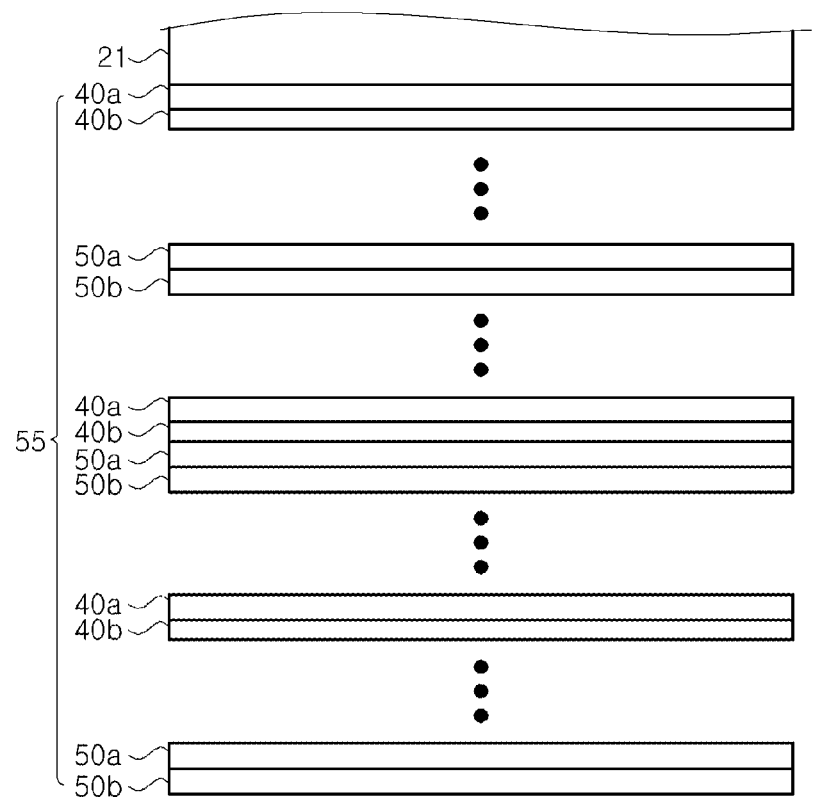
FIG. 5 is a cross-sectional view showing a distributed Bragg reflector according to another exemplary embodiment of the present invention.

FIG. 5 is a cross-sectional view showing a distributed Bragg reflector 55 according to another exemplary embodiment of the present invention. The light emitting diode chip according to the present exemplary embodiment is substantially similar to the light emitting diode chip described with reference to FIG. 3 and FIG. 4. FIG. 3 and FIG. 4 show and describe when the distributed Bragg reflector 45 has the stacked structure of the first distributed Bragg reflector 40 and the second distributed Bragg reflector 50. On the other hand, in the distributed Bragg reflector 55 according to the present exemplary embodiment, a plurality of pairs of first material layers 40a and second material layers 40b are mixed with a plurality of pairs of third material layers 50a and a fourth material layers 50b. In other words, at least one pair of the third material layer 50a and the fourth material layer 50b is positioned between the plurality of pairs of the first material layer 40a and the second material layer 40b. Further, at least one pair of the first material layer 40a and the second material layer 40b is positioned between the plurality of pairs of the third material layer 50a and the fourth material layer 50b. In this configuration, the optical thickness of the first to fourth material layers 40a, 40b, 50a, and 50b is controlled to have high reflectivity for light over the wide visible range. Therefore, the optical thickness of each material layer configuring the distributed Bragg reflector may be different from each other.

The distributed Bragg reflector 55 may be positioned on the lower portion of the substrate 21 but is not limited thereto and may be positioned between the substrate 21 and the light emitting structure 30 (see FIG. 3).

Figure 6:
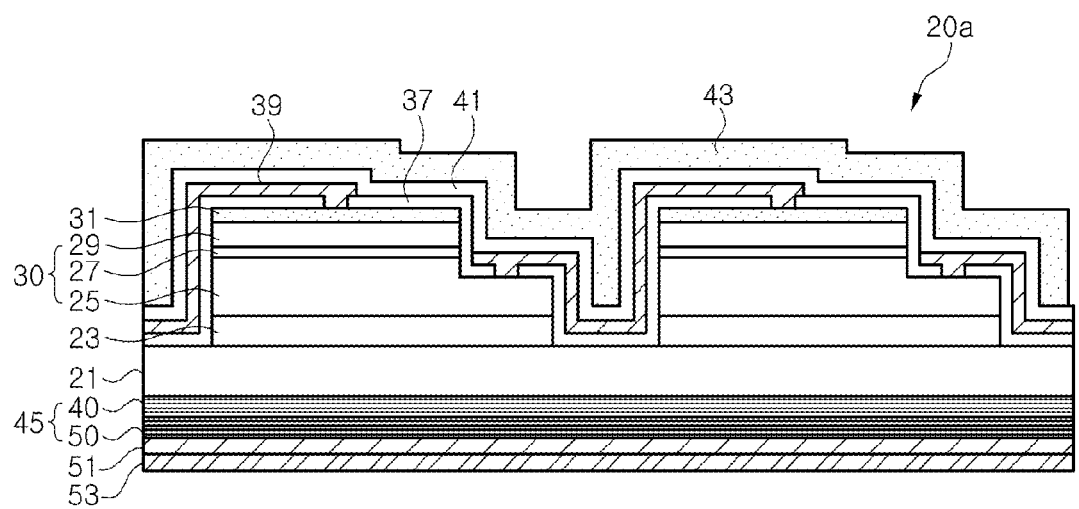
FIG. 6 is a cross-sectional view showing a light emitting diode chip having a plurality of light emitting cells according to another exemplary embodiment of the present invention.
Figure 16:
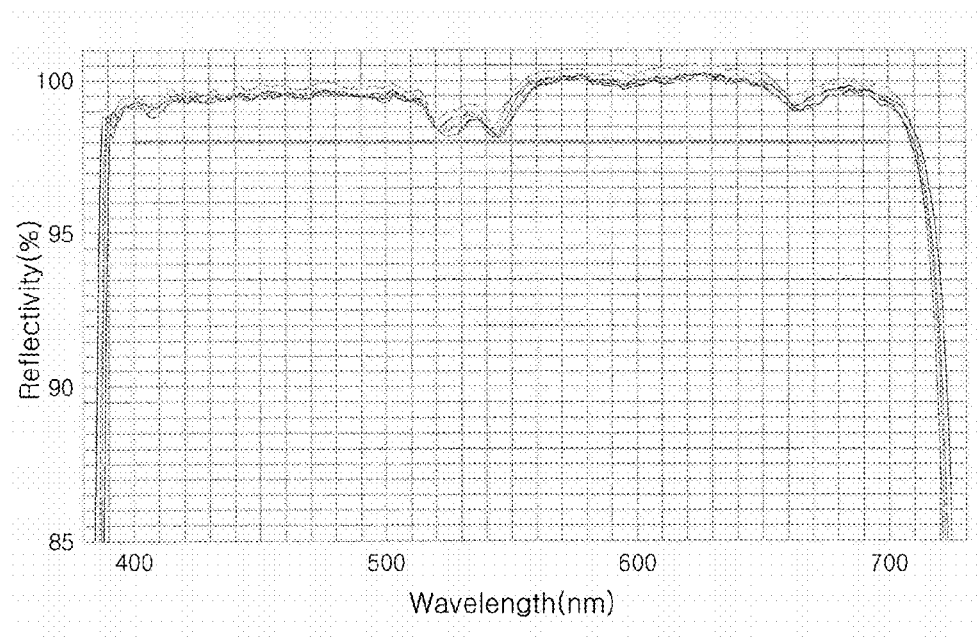
FIG. 16 is a graph showing reflectivity of a distributed Bragg reflector on the sapphire substrate according to an exemplary embodiment of the present invention.

FIG. 16 is a graph showing reflectivity of a distributed Bragg reflector on the sapphire substrate according to an exemplary embodiment of the present invention. In this case, the distributed Bragg reflector has been formed using $TiO_2/SiO_2$. As shown in FIG. 4, the distributed Bragg reflector was formed to have the stacked structure of the first distributed Bragg reflector 40 and the second distributed Bragg reflector 50. The reflectivity was measured over the entire wavelength range of the visible light and the same sample was measured seven times. The first distributed Bragg reflector 40 has a central wavelength of about 630 nm and the second distributed Bragg reflector 50 has a central wavelength of about 460 nm. As shown in FIG. 6, the reflectivity of 90% or more, even 98% or more, for light of a blue wavelength range of 400 to 500 nm, light of a green wavelength range of 500 to 600 nm, and light of a red wavelength range of 600 to 700 nm may be obtained by using a distributed Bragg reflector according to an exemplary embodiment of the present invention.

Meanwhile, the high reflectivity of 98% or more is obtained over the entire range of 400 to 700 nm as shown in FIG. 16. However, even a case where the reflectivity less than 98% is obtained in a part of the intermediate range is embodied by the present invention, if a distributed Bragg reflector having two or more central wavelengths is formed.

FIG. 6 is a cross-sectional view showing a light emitting diode chip 20a having a plurality of light emitting cells according to another exemplary embodiment of the present invention.

Referring to FIG. 6, the light emitting diode chip 20a includes a plurality of light emitting cells on the substrate 21. In addition, the light emitting diode chip 20a may include a distributed Bragg reflector 45 and metal layers 51 and/or 53.

The substrate 21 and the distributed Bragg reflector 45 is similar to the distributed Bragg reflector described with referenced to FIG. 3, FIG. 4 and FIG. 5 and therefore, a detailed description thereof will be omitted. However, the substrate 21 may be an insulator to electrically isolate the plurality of light emitting cells. For example, the substrate 21 may be a patterned sapphire substrate.

Meanwhile, the plurality of light emitting cells 30 are positioned to be spaced apart from each other. Each of the plurality of light emitting cells 30 is the same as the light emitting structure 30 with reference to FIG. 3 and the detailed description thereof will be omitted. In addition, the buffer layers 23 may be interposed between the light emitting cells 30 and the substrate 21 and the buffer layers 23 may be also spaced apart from each other.

The first insulating layer 37 covers the front surface of the light emitting cells 30. A first insulating layer 37 has openings on the first conductive-type semiconductor layers 25 and openings on the second conductive-type semiconductor layers 29. The side walls of the light emitting cells 30 are covered by the first insulating layer 37. The first insulating layer 37 also covers the substrate 21 in the regions between the light emitting cells 30. The first insulating layer 37 may be formed of a silicon oxide ($SiO_2$) layer or a silicon nitride layer and may be a layer formed in a temperature range of 200° C. to 300° C. using a plasma chemical vapor deposition method. In this case, the first insulating layer 37 may be formed to have a thickness of 4500 Å to 1 µm. When the first insulating layer is formed to have a thickness less than 4500 Å, the first insulating layer having a relatively small thickness is formed due to step coverage characteristics at the bottom sides of the light emitting cells and an electrical short circuit between the wirings and the light emitting cells formed on the first insulating layer may occur. Meanwhile, as the thickness of the first insulating layer becomes greater, an electrical short circuit may be prevented but light transmittance may be deteriorated to reduce the luminous efficiency. Therefore, it is preferable that the first insulating layer is formed not to exceed a thickness of 1 µm.

Meanwhile, the wirings 39 are formed on the first insulating layer 37. The wirings 39 are electrically connected to the first conductive-type semiconductor layers 25 and the second conductive-type semiconductor layers 29 through the openings. The transparent electrode layers 31 may be disposed on the second conductive-type semiconductor layers 29 and the wirings may be connected to the transparent electrode layers 31. Further, the wirings 39 electrically connect the first conductive-type semiconductor layers 25 to the second conductive-type semiconductors 29, respectively, of the adjacent light emitting cells 30, such that a serial array of the light emitting cells 30 may be formed. A plurality of serial arrays may be formed and are connected to each other in reverse parallel so that they may be connected to an alternating current (AC) power supply. In addition, a bridge rectifier (not shown) connected to the serial arrays of the light emitting cells may be connected and the light emitting cells may be driven under the AC power supply by the bridge rectifier. The bridge rectifier may be formed by connecting the light emitting cells having the same structure as the light emitting cells 30 using the wirings 39.

On the other hand, the wirings may connect the first conductive-type semiconductor layers 25 of the adjacent light emitting cells to each other or connect the second conductive-type semiconductor layers 29 of the adjacent light emitting cells to each other. Therefore, the plurality of light emitting cells 30 connected in series and parallel may be provided.

The wirings 39 may be made of a conductive material, for example, doped semiconductor material such as polycrystalline silicon or metal. In particular, the wirings 39 may be formed in a multi-layer structure and may include, for example, a lower layer of Cr or Ti and an upper layer of Cr or Ti. Further, the metal layer of Au, Au/Ni, or Au/Al may be interposed between the lower layer and the upper layer.

The second insulating layer 41 may cover the wirings 39 and the first insulating layer 37. The second insulating layer 41 prevents the wirings 39 from being polluted from moisture, or the like and prevents the wirings 39 and the light emitting cells 30 from being damaged from external impact.

The second insulating layer 41 may be formed of the same material as the first insulating layer 37 and the silicon oxide layer or the silicon nitride layer. The second insulating layer 41 may be a layer formed in the temperature range of 200° C. to 300° C. by using the PECVD method, similar to the first insulating layer. In addition, when the first insulating layer 37 is a layer formed by using the PECVD method, the second insulating layer 41 may be deposited in the temperature range of −20% to +20% for the deposition temperature of the first insulating layer 37, or may be deposited in the same deposition temperature.

Meanwhile, the second insulating layer 41 may be relatively thin as compared to the first insulating layer 37, and may have a thickness of 500 Å or more. The second insulating layer 41 is relatively thinner than the first insulating layer 37, which can prevent the second insulating layer from peeling off from the first insulating layer. In addition, when the second insulating layer is thinner than 2500 Å, it may be difficult to protect the wiring and the light emitting cell from external impact or moisture permeation.

Meanwhile, a phosphor layer 43 may be positioned on the light emitting diode chip 20a. The phosphor layer 43 may be a layer in which resin is dispersed in a phosphor or a layer deposited by an electrophoresis method. The phosphor layer 43 covers the second insulating layer 41, thereby converting the wavelength of light emitted from the light emitting cells 30.

Figure 7:
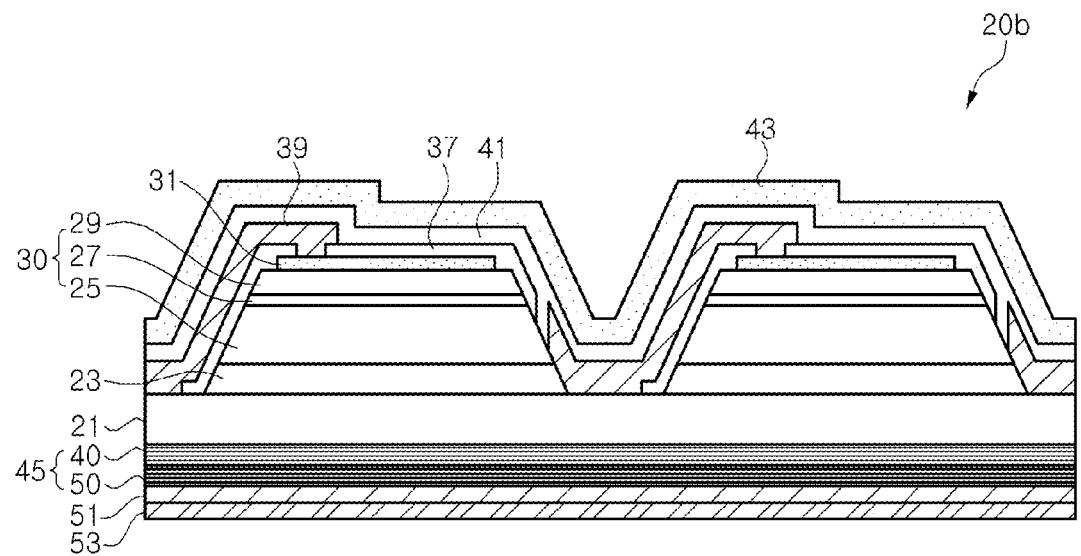
FIG. 7 is a cross sectional view showing a light emitting diode chip having a plurality of light emitting cells according to another exemplary embodiment of the present invention.

FIG. 7 is a cross-sectional view for explaining a light emitting diode chip 20b having a plurality of light emitting cells according to another exemplary embodiment of the present invention.

Referring to FIG. 7, the light emitting diode chip 20b according to the present exemplary embodiment is substantially similar to the above-mentioned light emitting diode chip 20a, but they are different in terms of the shape of the light emitting cells 30 and the portion of the first conductive-type semiconductor layer 25 to which the wirings 39 are connected.

That is, the light emitting cells 30 of the light emitting diode chip 20a has the exposed upper surface of the first conductive-type semiconductor 25 and the wiring 39 is connected to the upper surface of the first conductive-type semiconductor layer 25. Unlike the light emitting diode chip 20a, the light emitting cells 30 of the light emitting diode chip 20b according to the present exemplary embodiment is formed to have an inclined side surface to expose the inclined side surface of the first conductive-type semiconductor layer 25 and the wiring 39 is connected to the inclined side surface of the first conductive-type semiconductor layer 25.

Therefore, according to the present exemplary embodiment, there is no need to perform a separate process of exposing the upper surface of the first conductive-type semiconductor layer 25 other than the process of separating the light emitting cells, thereby making it possible to simplify the process. Further, there is no need to expose the upper surface of the first conductive-type semiconductor layer 25, thereby making it possible to prevent the area of the active layer 27 from being reduced. In addition, since the wiring 39 is connected along the inclined surface of the first conductive-type semiconductor layer 25, the current spreading performance of the light emitting cell 30 may be improved and thus, the forward voltage may be reduced and the reliability of the light emitting diode chip 20b may be improved.

Figure 17:
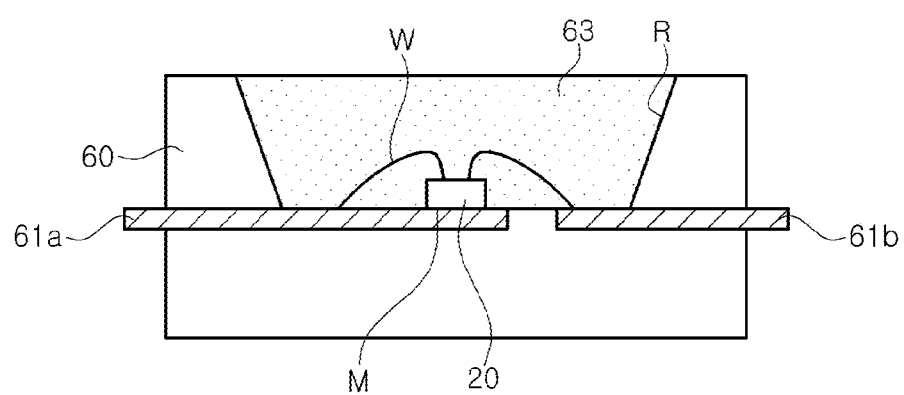
FIG. 17 is a cross-sectional view showing a light emitting diode package mounted with the light emitting diode chip having the distributed Bragg reflector according to an exemplary embodiment of the present invention.

FIG. 17 is a cross-sectional view showing a light emitting diode package mounted with the light emitting diode chip having the distributed Bragg reflector according to an exemplary embodiment of the present invention.

Referring to FIG. 17, the light emitting diode package includes a package body 60, leads 61a and 61b, light emitting diode chips 20 or 20a (not shown), and a molding part 63. The package body 60 may be made of plastic resin, but is not limited thereto.

The package body 60 has a mounting surface M for mounting the light emitting diode chip 20 and also has a reflecting surface R to reflect light emitted from the light emitting diode chip 20. Meanwhile, the light emitting diode chip 20 is mounted on the mounting surface M and is electrically connected to leads 61a and 61b through bonding wires W.

The light emitting diode chip 20 may have the distributed Bragg reflector 45 described with reference to FIG. 3 and FIG. 4 or may have the distributed Bragg reflector 55 described with reference to FIG. 5.

Meanwhile, the light emitting diode package emits the mixed color light, for example, white light. To this end, the light emitting diode package may include a phosphor for converting the wavelength of light emitted from the light emitting diode chip 20. The phosphor may be included in the molding part 63 but is not limited thereto.

Since the light emitting diode chip 20 includes the distributed Bragg reflector 45 or 55, when the light wavelength-converted in the phosphor faces the mounting surface M through the light emitting diode chip 20, the light is reflected to have high reflectivity while being emitted to the outside by the wavelength-converted light or the distributed Bragg reflector 45 or 55. Therefore, the light emitting diode package having higher light emission efficiency may be provided as compared to the light emitting diode package according to the related art.

Although the present exemplary embodiment describes the package including the phosphor together with the light emitting diode chip 20 in order to implement white light, the present invention is not limited thereto. The light emitting diode chip may be used with any package capable of emitting white light.

In addition, although the present exemplary embodiment describes when the light emitting diode chip 20 is mounted, the light emitting diode chip 20a may be mounted on the mounting surface M with reference to FIG. 6. When the light emitting diode chip 20a includes the phosphor layer 43, the phosphor in the molding part 63 may be omitted.

Figure 18:
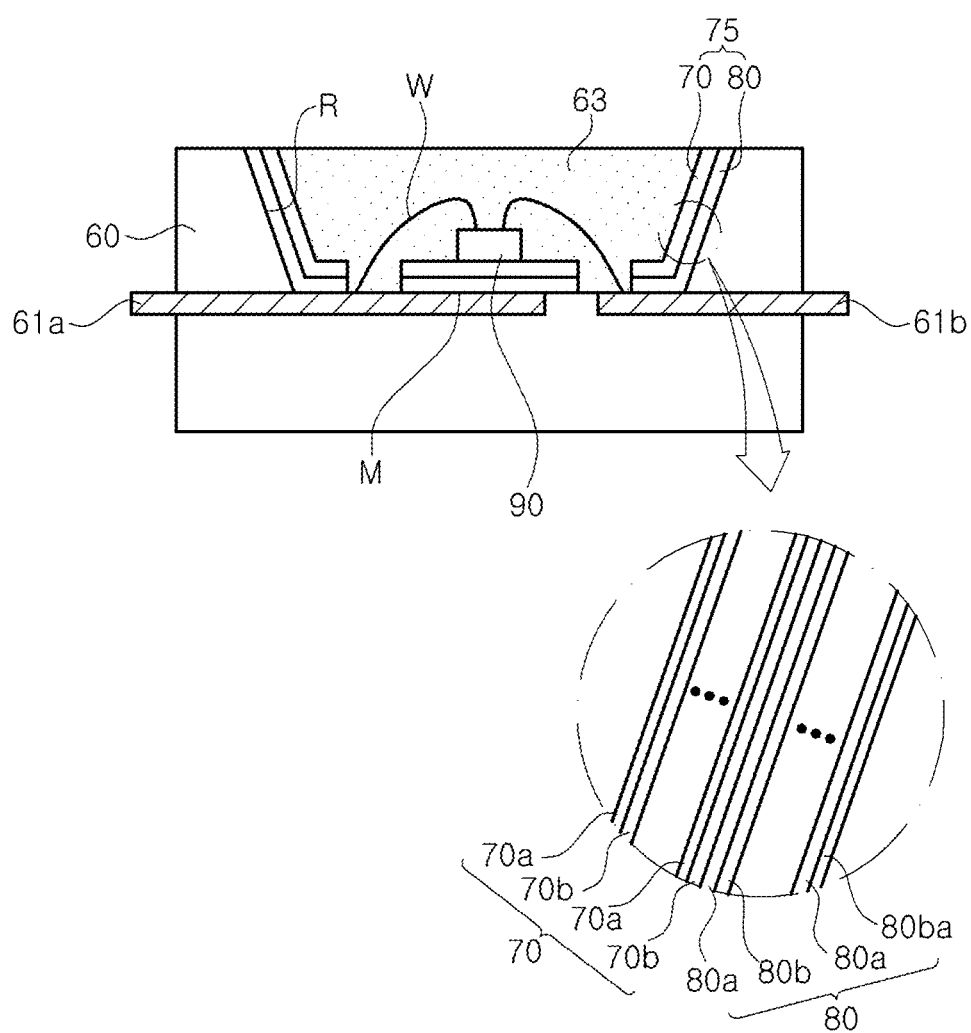
FIG. 18 is a cross-sectional view showing the light emitting diode package having the distributed Bragg reflector according to another exemplary embodiment of the present invention.

FIG. 18 is a cross-sectional view showing the light emitting diode package having the distributed Bragg reflector according to another exemplary embodiment of the present invention.

Referring to FIG. 18, the light emitting diode package is similar to the light emitting diode package described with reference to FIG. 17. However, there is a difference in that a distributed Bragg reflector 75 is formed on the reflecting surface R. In addition, in the present exemplary embodiment, the light emitting diode chip 90 may not have the distributed Bragg reflector 45 or 55 described in FIG. 4 or FIG. 5.

The distributed Bragg reflector 75 may include a first distributed Bragg reflector 70 and a second distributed Bragg reflector 80. The first distributed Bragg reflector 70 and the second distributed Bragg reflector 80 may each have the stacked structure of the same material layer as the first and second distributed Bragg reflectors 40 and 50 with reference to FIG. 4. That is, the first distributed Bragg reflector 70 may be formed in the plurality of pairs of first material layer 70a and second material layer 70b and the second distributed Bragg reflector 80 may be formed in a plurality of pairs of third material layer 80a and fourth material layer 80b. These first to fourth material layers 70a, 70b, 80a, and 80b are the same as the first to fourth layers 40a, 40b, 50a, and 50b described with reference to FIG. 4 and therefore, the detailed description thereof will be omitted.

High reflectivity may be provided over a wide wavelength range of the visible range by the distributed Bragg reflector 75 and therefore, the light emission efficiency of the light emitting diode package may be improved.

Meanwhile, the distributed Bragg reflector may be formed by mixing the plurality of pairs of first and second material layers 70a and 70b and a plurality of pairs of third and fourth material layers 80a and 80b, similar to one described with reference to FIG. 5.

The distributed Bragg reflector 75 may be formed using the ion assisted deposition method performed at a relatively low temperature. Therefore, the distributed Bragg reflector 75 may be formed without damaging the package body 60 made of plastic resin or the leads 61a and 61b. The distributed Bragg reflector 75 may be formed over the entire region other than the lead regions for bonding the wires.

Meanwhile, a light emitting diode chip 90 may include the distributed Bragg reflector like the light emitting diode chips 20 or 20a of FIG. 6 but is not limited thereto. The light emitting diode chip 90 may be the general light emitting diode chip according to the related art.

According to the present exemplary embodiment, the distributed Bragg reflector having reflectivity of 90% or more for the light of the blue wavelength range, the light of the green wavelength range, and the light of the red wavelength range is installed, thereby making it possible to the light emitting diode package with the improved light emission efficiency.

EXPERIMENTAL EXAMPLE

Figure 8:
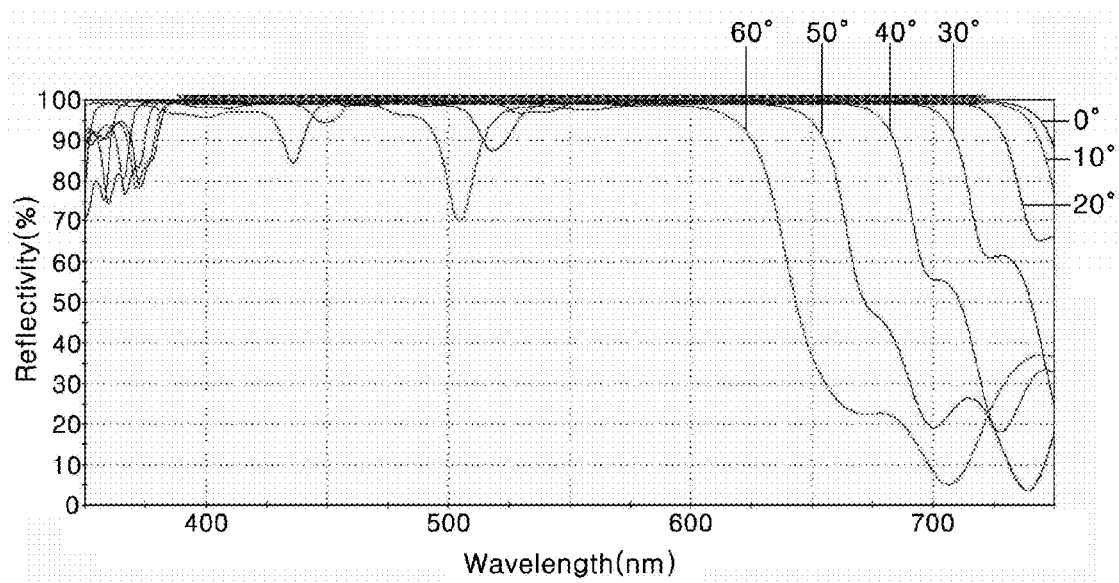
FIG. 8 is a simulation graph showing a change in reflectivity of a distributed Bragg reflector according to an incident angle.

FIG. 8 is a simulation graph showing a change in reflectivity of a distributed Bragg reflector according to an incident angle. In this case, the distributed Bragg reflector is made by alternately stacking SiO2 and TiO2 on a glass substrate by 40 layers. The thickness of each layer is individually controlled to have the reflectivity of 99% or more over the entire area of 400 nm to 700 nm at an incident angle of 0°. Therefore, the thickness of the entire distributed Bragg reflector is 2.908 Meanwhile, in the case of the substantially used light emitting diode chip, light incident at an incident angle of about 60° or more is totally reflected due to the difference in refractive index between the sapphire substrate (n equals about 1.78) and SiO2 (n equals about 1.48) and thus, the simulation for the incident angle of 60° or more is omitted. Meanwhile, the graph of FIG. 8 shows the entire visible area at the portion of 100% reflectivity (which was similarly shown in the graph of FIG. 9).

As can be appreciated from the graph of FIG. 8, the distributed Bragg reflector of 40 layers shows very high reflectivity of 99% or more with reference to the incident angle of 0° in the entire visible area. However, as the incident angle of light incident to the distributed Bragg reflector is increased, it can be appreciated that the reflectivity for the visible light of a long wavelength is degraded. When the incident angle exceeds 30°, the reflectivity for light of 700 nm wavelength is reduced to 99% or less.

Figure 9A:
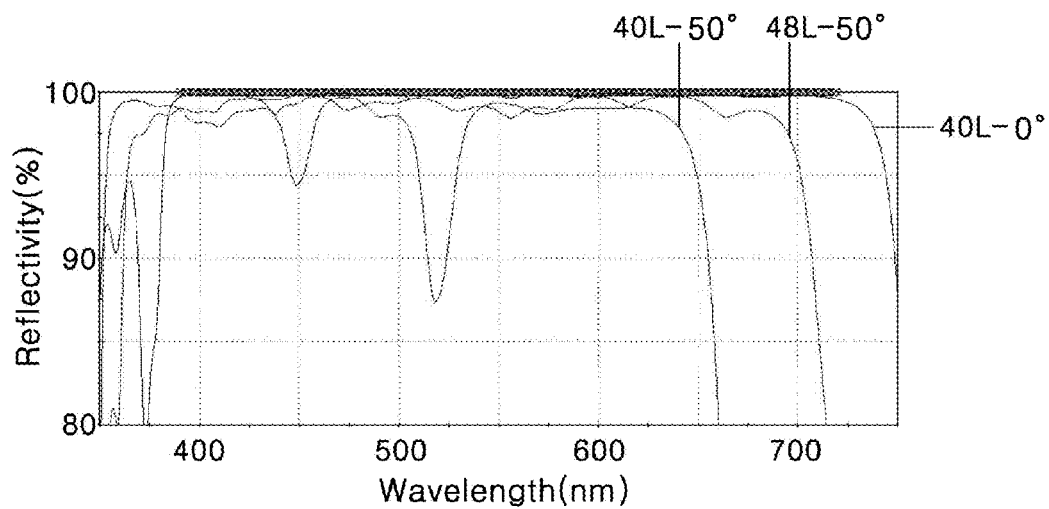
FIG. 9A and FIG. 9B each show examples of improving reflectivity for long wavelength incident light at an incident angle of 50° and 60° by increasing the stacking number of the distributed Bragg reflector.
Figure 9B:
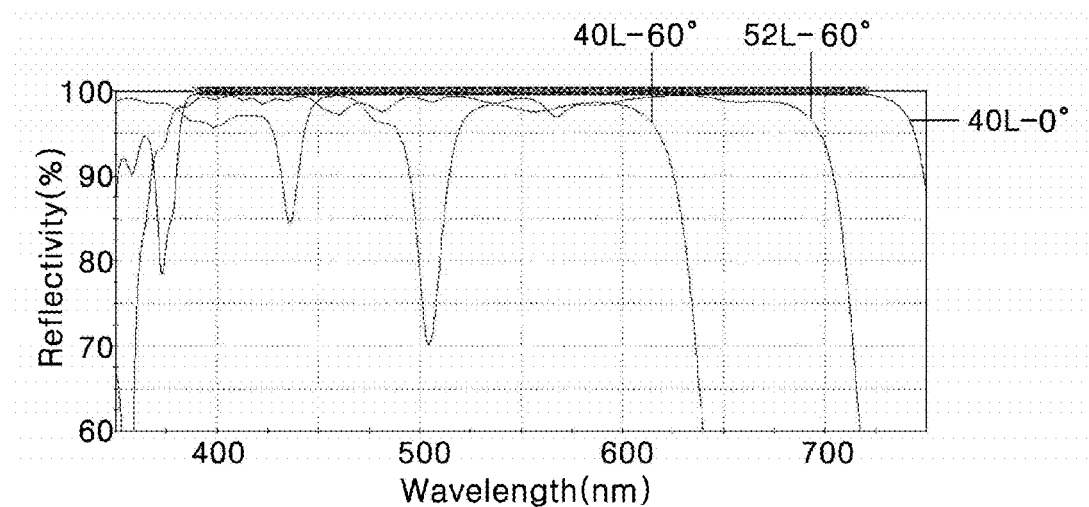

FIG. 9A and FIG. 9B each show examples of improving reflectivity for long wavelength incident light at an incident angle of 50° and 60° by increasing the stacking number of the distributed Bragg reflector.

Referring to FIG. 9A and FIG. 9B, as described in FIG. 8, in the case of the reference distributed Bragg reflector having 40 layers (40L) of 2.908 μm total thickness, the reflectivity (40L—50°) for the incident angle of 50° and the reflectivity (40L—60°) for the incident angle of 60° is reduced greater than the reflectivity (40L—0°) for the incident angle of 0° in the visible area of a long wavelength. In addition, the portion where the reflectivity is degraded at the intermediate area of the visible area, for example, in the vicinity of 510 nm to 520 nm occurs.

However, when the number of layers of the distributed Bragg reflector is increased to 48 layers (total thickness: 3.829 μm) or 52 layers (total thickness: 4.367 μm), it is possible to obtain substantially uniform high reflectivity over the wide wavelength area even though the incident angle is large.

Therefore, an increase in the stacking number of the distributed Bragg reflector makes it possible to improve the reflectivity as well as maintain the high reflectivity for light incident at a large incident angle. However, the increase in the stacking number of the distributed Bragg reflector leads to the increase in the process time and may result in cracks in the distributed Bragg reflector.

FIG. 10A and FIG. 10B each are plan views showing the distributed Bragg reflector after a dicing process is performed. In this case, FIG. 10A shows the case where the distributed Bragg reflector of 40 layers is stacked by an ion assisted deposition method and FIG. 10B shows the case in which the distributed Bragg reflector of 48 layers are stacked by the ion assisted deposition method.

When 40 layers are stacked (FIG. 10A), cracks do not occur in the distributed Bragg reflector and when 48 layers are stacked (FIG. 10B), cracks occur in the distributed Bragg reflector. When 52 layers are stacked (not shown), cracks may similarly occur.

The reason why cracks occurs in the distributed Bragg reflector is unclear, but is considered as being associated with the ion assisted deposition method. That is, since the high-density layers are deposited by colliding ions, stress is accumulated in the distributed Bragg reflector and thus, cracks may occur in the distributed Bragg reflector during the dicing of the substrate. Therefore, it may not be suitable to mass-produce the light emitting diode chip by simply increasing the stacking number.

In connection with this understanding, as described in FIG. 3, the reflective metal layer may be formed in the distributed Bragg reflector, such that the relatively high reflectivity for light having a large incident angle may be maintained.

Table 1 shows the stacking number of the distributed Bragg reflector, a kind of epoxy, and a relative light emission efficiency in the white light emitting diode package state according to whether the reflective metal layer (Al) is applied. In these experimental examples, except for the distributed Bragg reflector, the reflective metal layer, and the type of epoxy, other conditions, for example, the kind of the light emitting diode chip and the kind of the package are the same. The stacking number of layers of the distributed Bragg reflector is 40 and the relative light emission efficiency with respect to the light emission efficiency of the light emitting diode package (sample number 1) of the light emitting diode chip to which the Al reflective metal layer is not applied (shown by an "X") is represented by %.

TABLE 1

| Sample No. | Stacking Number | Apply Reflective Metal Layer (Al) | Kind of Epoxy | Relative Light Emission Efficiency (%) |
|---|---|---|---|---|
| 1 | 40 Layer | X | Silver Epoxy | 100 |
| 2 | 40 Layer | X | Transparent Epoxy | 106.8 |
| 3 | 40 Layer | O | Silver Epoxy | 109.7 |
| 4 | 40 Layer | O | Transparent Epoxy | 108.6 |
| 5 | 48 Layer | X | Silver Epoxy | 106.4 |
| 6 | 48 Layer | X | Transparent Epoxy | 110.9 |
| 7 | 48 Layer | O | Silver Epoxy | 109.8 |

Comparing samples 1 and 2, and samples 5 and 6, when the Al reflective metal layer is not applied, it can be appreciated that the difference in the light emission efficiency appears according to the kind of epoxy used as an adhesive. That is, a sample using a transparent epoxy shows higher light emission efficiency than in a sample using a silver epoxy. This shows that the reflectivity of the distributed Bragg reflectivity is affected by the adhesive, when there is no Al reflective metal layer.

Meanwhile, when the same kind of adhesive is used, the sample to which the Al reflective metal layer is applied (shown by an "O") shows higher light emission efficiency than other samples. For example, comparing samples 1 and 3, samples 2 and 4, and samples 5 and 7, it can be appreciated that the light emission efficiency is improved when the Al reflective metal layer is applied.

Meanwhile, comparing sample 1 and sample 5, and sample 2 and sample 6, when the same adhesive is used and the Al reflective metal layer is not applied, it can be appreciated that the light emission efficiency is improved according to the increase in the stacking number. It is understood that the increase of the stacking number of distributed Bragg reflector improves reflectivity of the distributed Bragg reflector in the wide incident angle range, thereby resulting to improvement of the light emission efficiency.

However, comparing sample 3 and sample 7, when the Al reflective metal layer and the silver epoxy are applied, there is no difference in the light emission efficiency despite the increase in stacking number. Relatively high reflectivity is maintained for the visible light of the long wavelength having a large incident angle by the Al reflective metal layer. Therefore, when the distributed Bragg reflector and the reflective metal layer are applied, it can be appreciated that the good light emission efficiency can be achieved at the package level while reducing the stacking number of the distributed Bragg reflector. In addition, the reduction in the stacking number of the distributed Bragg reflector can prevent cracks occurring in the distributed Bragg reflector.

Meanwhile, when the Al reflective metal layer is applied to the distributed Bragg reflector, it is observed that the reflectivity of the distributed Bragg reflector is reduced at the chip level. This phenomenon is considered as being closely associated with the surface roughness of the substrate. Hereinafter, it will be described that the surface roughness of the substrate has an effect on the reflectivity of the distributed Bragg reflector at the chip level.

FIG. 11 is a graph showing the reflectivity of the distributed Bragg reflector according to whether or not the CMP is performed after a sapphire substrate lapping process using a copper surface plate.

First, after the rear surface of the sapphire substrate is ground, the lapping process using the copper surface plate was performed by using the diamond slurry having a particle of 3 μm. After the lapping process was performed using the copper surface plate, the surface roughness of the rear surface of the sapphire substrate showed a root-mean-square (RMS) value of about 5.12 nm at an area of 5 μm×5 μm.

Thereafter, after the rear surface of the sapphire substrate is subjected to the CMP process, the above-mentioned first distributed Bragg reflector and second distributed Bragg reflector are formed by controlling the thickness of TiO2 and SiO2 to fabricate the sample (Example 1). On the other hand, the comparative example directly formed the distributed Bragg reflector similar to Example 1 without performing the CMP process to fabricate the sample. The CMP process was performed using a slurry of SiO2 at a load of 20 kg and the surface roughness of the sapphire substrate showed the RMS value of about 0.25 nm at an area of 5 μm×5 μm after the CMP process.

In the case of the comparative example, the reflectivity of the distributed Bragg reflector showed approximately 90% or more in the visible range as shown in FIG. 10, but the reflectivity was irregular according to the wavelength and showed the value of 90% or less in the vicinity of 550 nm. On the other hand, in the case of example 1, most of the reflectivity of the distributed Bragg reflector showed a value close to 100% over the wide wavelength range of the visible light.

Figure 12:
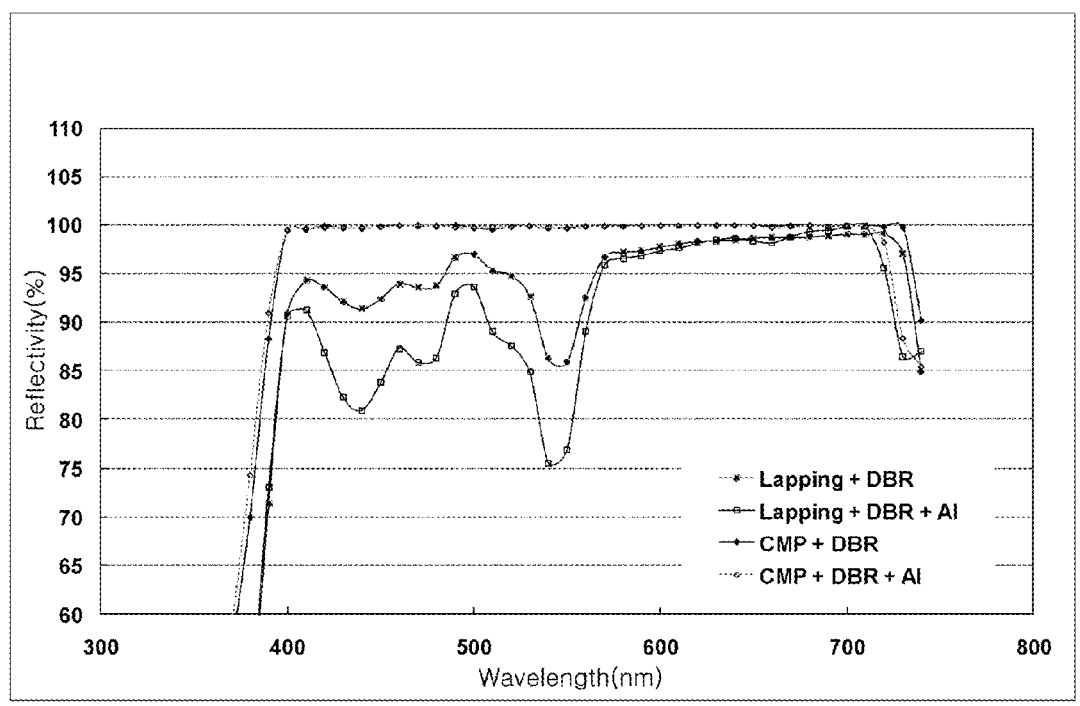
FIG. 12 is a graph showing the reflectivity after an aluminum reflective metal layer is deposited on the distributed Bragg reflector manufactured in the similar manner as FIG. 11.

FIG. 12 is a graph showing the reflectivity after an aluminum layer of about 500 nm is deposited on the sample fabricated in the same manner as the example and the comparative example of FIG. 11.

In the case of comparative example, it was confirmed that the reflectivity was considerably reduced after Al was deposited. On the other hand, in the case of the example, high reflectivity was maintained without reducing reflectivity even after Al was deposited.

In the comparative example, it is considered as the phenomenon that the reduction in the reflectivity is showed after Al was deposited since the distributed Bragg reflector according to the comparative example formed on the sapphire surface having a rough surface was deformed by the interfacial defect while the Al was deposited using the electronic beam deposition technology. In the case of the example 1, since the surface roughness of the sapphire substrate is good, it is determined that reflectivity was maintained without deforming the distributed Bragg reflector while Al is deposited.

Figure 13:
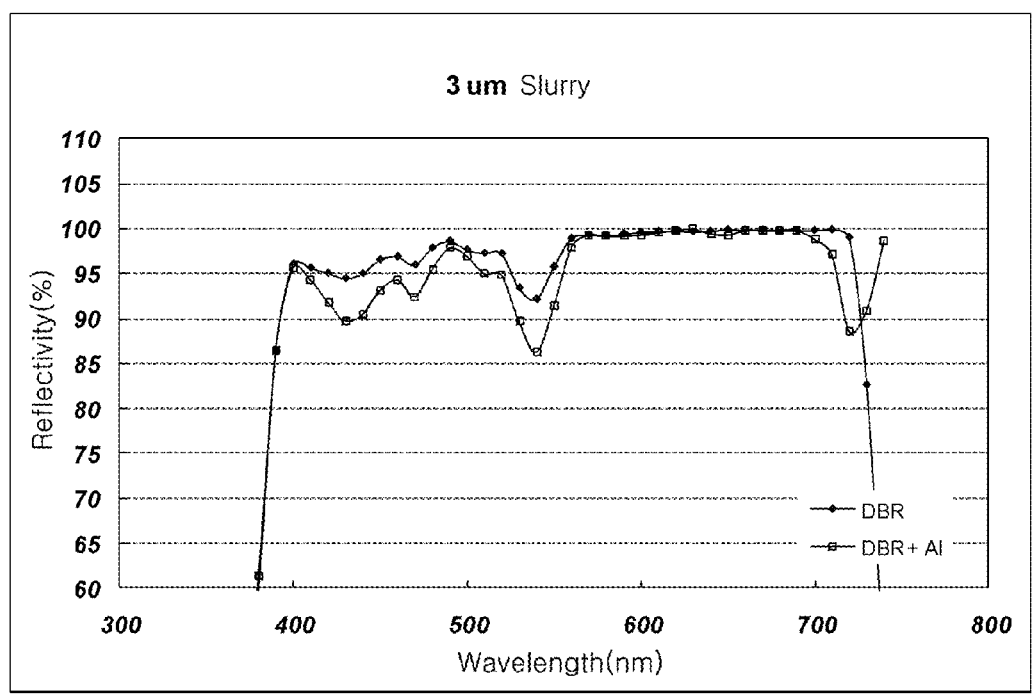
FIG. 13, FIG. 14, and FIG. 15 are graphs showing the reflectivity of the distributed Bragg reflector according to a size of a slurry particle during the lapping process using a tin surface plate.
Figure 14:
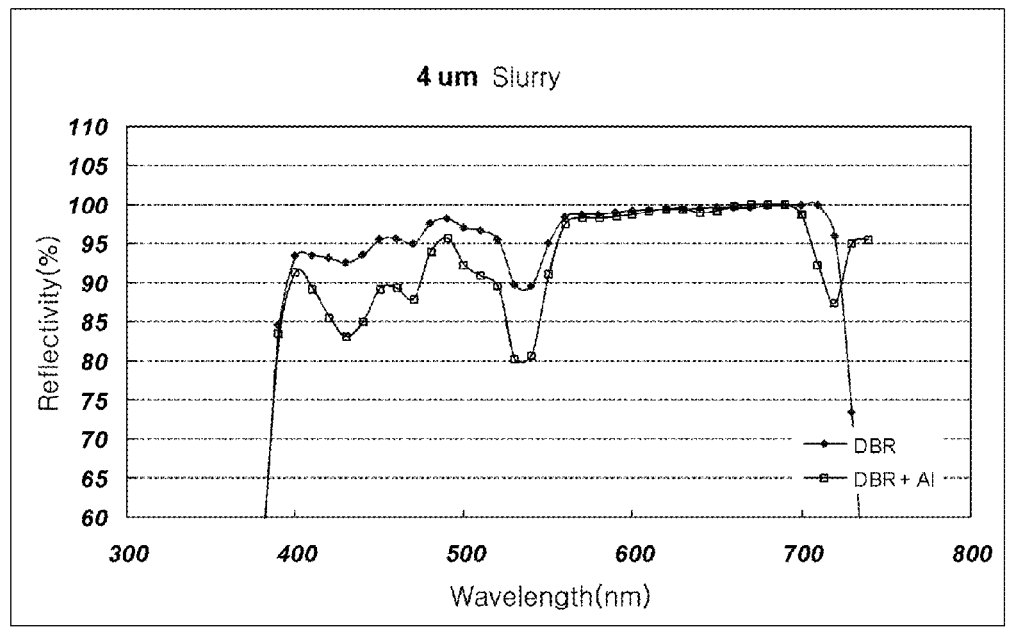
Figure 15:
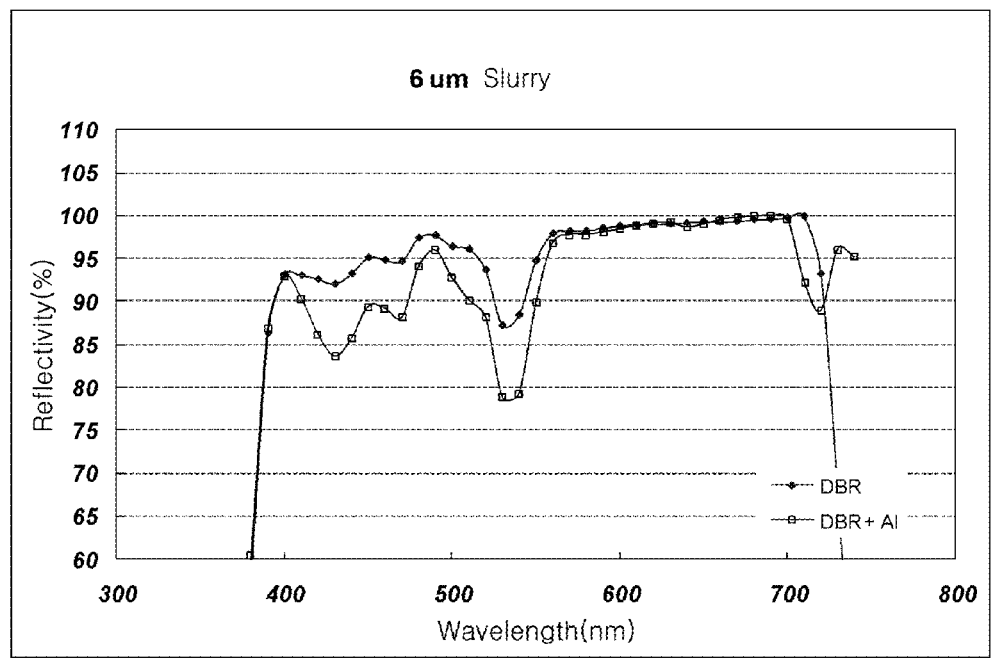

FIG. 13, FIG. 14 and FIG. 15 are graphs showing the reflectivity of the distributed Bragg reflector according to a size of a slurry particle during the lapping process using a tin surface plate.

In this configuration, the size of the slurry included in the diamond particle and the diamond particle was 3 μm, 4 μm, and 6 μm, respectively. The surface roughness of the sapphire substrate showed the RMS value of about 2.40 nm, 3.35 nm, and 4.18 nm according to the size of the diamond particle after the lapping process was performed using a tin surface plate.

The same distributed Bragg reflector as Example 1 was formed after the lapping process was performed by the tin surface plate and Al of 500 nm was deposited as in the example of FIG. 8.

As could be appreciated from the figures, the reflectivity of the distributed Bragg reflector was 90% or more over the wide wavelength range of the visible range after the lapping process was performed using the slurry of 3 μm and the tin surface plate. However, when the Al was deposited, the reflectivity was slightly reduced in the vicinity of 550 nm.

In contrast, as shown in FIG. 14 and FIG. 15, the reflectivity of the distributed Bragg reflector does not reach 90% in the vicinity of 550 nm after the lapping process was performed using the slurry of 4 μm or 6 μm and the tin surface plate, and the reflectivity was reduced to 80% or less after Al was deposited.

It can be appreciated from the above experimental example that the surface roughness of the sapphire substrate has an effect on the reflectivity of the distributed Bragg reflector before the distributed Bragg reflector is formed. In addition, when the surface roughness of the sapphire substrate is controlled to have the RMS value of 3 nm or less, the reflectivity characteristics were relatively improved. Further, when the surface roughness of the sapphire substrate is 1 nm or less, it is expected that the reflectivity would not be reduced even after Al was deposited.

As apparent from the above description, according to the exemplary embodiments of the present invention, it is possible to provide the distributed Bragg reflector having high reflectivity over the wide visible range to improve light efficiency of the light emitting diode package implementing mixed color light, for example, white light. Further, it is also possible to reliably secure the reflectivity of the distributed Bragg reflector by controlling the surface roughness of the surface of the substrate on which the distributed Bragg reflector is formed.

It will be apparent to those skilled in the art that various modifications and variation can be made in the present invention without departing from the spirit or scope of the invention. Thus, it is intended that the present invention cover the modifications and variations of the present invention provided they come within the scope of the appended claims and their equivalents.

What is claimed is:

1. A light-emitting diode package, comprising:
a body and leads, the body comprising a mounting surface;
a light-emitting structure disposed on the mounting surface, the light-emitting structure comprising an active layer disposed between a first conductive-type semiconductor layer and a second conductive-type semiconductor layer;
a phosphor member disposed on the light-emitting structure; and
a distributed Bragg reflector disposed between the light-emitting structure and the mounting surface,
wherein the distributed Bragg reflector comprises a first distributed Bragg reflector and a second distributed Bragg reflector; and
wherein an optical thickness of material layers within the first distributed Bragg reflector is greater than an optical thickness of material layers within the second distributed Bragg reflector.

2. The light-emitting diode package of claim 1, wherein the light-emitting structure is disposed on the distributed Bragg reflector.

3. The light-emitting diode package of claim 2, wherein the distributed Bragg reflector contacts the light-emitting structure.

4. The light-emitting diode package of claim 1, wherein the first distributed Bragg reflector is disposed between the light-emitting structure and the second distributed Bragg reflector.

5. The light-emitting diode package of claim 1, further comprising wiring bonded to the light-emitting structure,
wherein the distributed Bragg reflector is disposed in a first region spaced apart from a second region where the wiring is bonded to the light-emitting structure.

6. The light-emitting diode package of claim 1, further comprising a first insulating layer covering a front surface of the light-emitting structure.

7. The light-emitting diode package of claim 6, further comprising a second insulating layer and wiring disposed on the first insulating layer, the second insulating layer covering the wiring and the first insulating layer.

8. The light-emitting diode package of claim 7, wherein the wiring connects the first conductive-type semiconductor layer or the second conductive-type semiconductor layer of the light-emitting structure through an opening in the first insulating layer.

9. The light-emitting diode package of claim 7, wherein the second insulating layer is thinner than the first insulating layer.

10. The light-emitting diode package of claim 1, wherein:
the first distributed Bragg reflector comprises higher reflectivity for light in a green wavelength range or a red wavelength range than for light in a blue wavelength range; and
the second distributed Bragg reflector comprises higher reflectivity for light in a blue wavelength range than for light in a red wavelength range.

11. The light-emitting diode package of claim 10, wherein a central wavelength of the first distributed Bragg reflector is longer than a central wavelength of the second distributed Bragg reflector.

12. The light-emitting diode package of claim 11, wherein the central wavelength of the first distributed Bragg reflector is about 630 nm and the central wavelength of the second distributed Bragg reflector is about 460 nm.

13. The light-emitting diode package of claim 1, wherein the light-emitting structure is configured to emit light in a blue wavelength range.

14. The light-emitting diode package of claim 12, wherein the body comprises a cavity and the light-emitting structure is disposed inside the cavity.

15. The light-emitting diode package of claim 12, wherein the body comprises a package body.

* * * * *